United States Patent
Larsson et al.

(10) Patent No.: US 8,142,848 B2
(45) Date of Patent: Mar. 27, 2012

(54) COATED CUTTING INSERT FOR MILLING

(75) Inventors: Andreas Larsson, Fagersta (SE); Anna Sandberg, Sala (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 13/239,938

(22) Filed: Sep. 22, 2011

(65) Prior Publication Data

US 2012/0009037 A1    Jan. 12, 2012

Related U.S. Application Data

(62) Division of application No. 12/248,435, filed on Oct. 9, 2008, now Pat. No. 8,053,064.

(30) Foreign Application Priority Data

Oct. 10, 2007  (SE) ..................................... 0702262

(51) Int. Cl.
*C23C 16/00* (2006.01)

(52) U.S. Cl. ................ 427/255.391; 76/44; 427/255.11; 427/255.19; 427/255.23; 427/255.28; 427/255.29; 427/255.36; 427/255.394; 427/419.1; 427/419.2; 427/419.7

(58) Field of Classification Search . 76/44; 427/255.11, 427/255.19, 255.23, 255.28, 255.29, 255.36, 427/255.391, 255.394, 419.1, 419.2, 419.7
See application file for complete search history.

(56) References Cited

U.S. PATENT DOCUMENTS

| | | | |
|---|---|---|---|
| 5,487,625 | A | 1/1996 | Ljungberg et al. |
| 5,863,640 | A | 1/1999 | Ljungberg et al. |
| 6,333,098 | B1 | 12/2001 | Olsson et al. |
| 6,337,152 | B1 | 1/2002 | Kukino et al. |
| 6,406,224 | B1 | 6/2002 | Ostlund et al. |
| 6,890,632 | B2 | 5/2005 | Larsson et al. |
| 7,135,221 | B2 | 11/2006 | Ruppi |
| 7,431,977 | B2 | 10/2008 | Hessman |

FOREIGN PATENT DOCUMENTS

| | | |
|---|---|---|
| EP | 1 352 697 | 10/2003 |
| EP | 1493845 | 1/2005 |
| EP | 1 655 391 | 5/2006 |
| WO | 2007/069973 | 6/2007 |
| WO | 2007069973 | 6/2007 |

*Primary Examiner* — Archene Turner

(74) *Attorney, Agent, or Firm* — Young & Thompson

(57) ABSTRACT

A coated cemented carbide insert is particularly useful for wet or dry milling steels at high cutting speeds, milling of hardened steels, and high feed copy milling of tool steels. The insert is formed by a cemented carbide body including WC, NbC and TaC, a W-alloyed Co binder phase, and a coating including an innermost layer of $TiC_xN_yO_z$, with equiaxed grains, a layer of $TiC_xN_yO_z$ with columnar grains and a layer of $\alpha\text{-}Al_2O_3$.

20 Claims, 1 Drawing Sheet

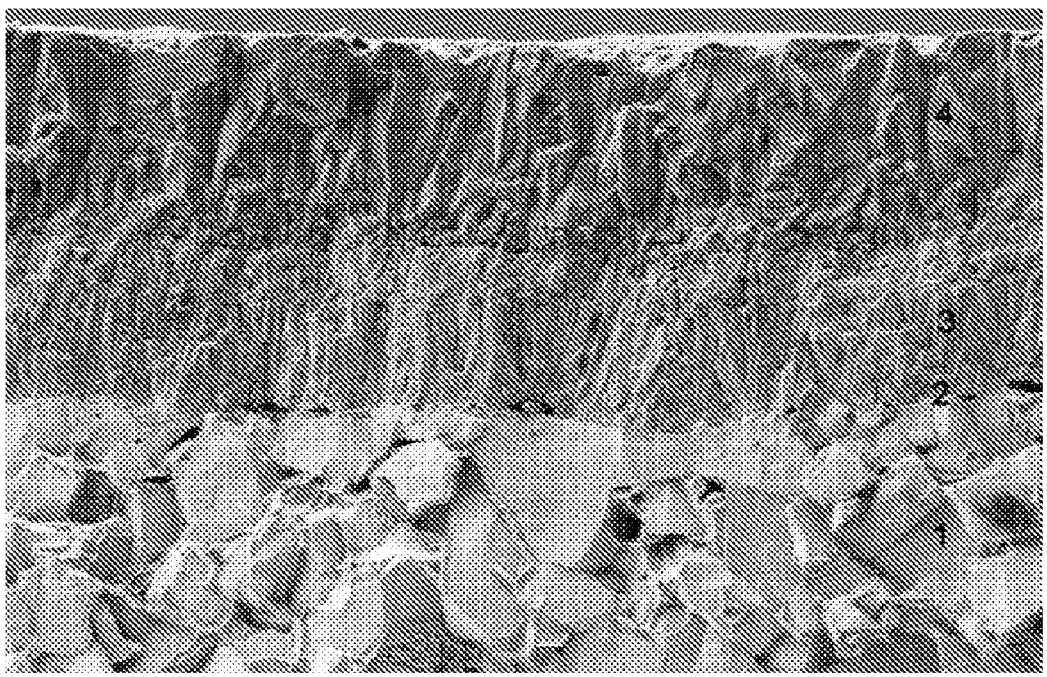

COATED CUTTING INSERT FOR MILLING

CROSS REFERENCE TO RELATED APPLICATIONS

This application is a division of application Ser. No. 12/248,435 filed on Oct. 9, 2008; which claimed priority to Swedish application 0702262-7 filed Oct. 10, 2007. The entire contents of each of the above-identified applications are hereby incorporated by reference.

FIELD OF THE INVENTION

The present invention relates to coated cemented carbide inserts (cutting tools), particularly useful for wet or dry milling of steels at high cutting speeds, milling of hardened steels, and high feed copy milling of tool steels.

When machining low and medium alloyed steels and hardened steels with cemented carbide tools, the cutting edge is worn according to different wear mechanisms, such as chemical wear, abrasive wear, adhesive wear and by edge chipping caused by cracks formed along the cutting edge. The domination of any of the wear mechanisms is determined by the application, and is dependent on properties of the machined material, applied cutting parameters, and the properties of the tool material. In general, it is very difficult to improve all tool properties simultaneously, and commercial cemented carbide grades have usually been optimized with respect to one or few of the above mentioned wear types, and have consequently been optimized for specific application areas.

EP 1493845 relates to a coated cemented carbide insert (cutting tool), particularly useful for milling of stainless steels and super alloys but also milling of steels in toughness demanding applications. The cutting tool insert is characterised by a cemented carbide body comprising WC, NbC and TaC, a W-alloyed Co binder phase, and a coating comprising an innermost layer of $TiC_xN_yO_z$ with equiaxed grains, a layer of $TiC_xN_yO_z$ with columnar grains and a layer of $\alpha\text{-}Al_2O_3$.

WO 2007/069973 discloses a coated cutting tool insert particularly useful for dry and wet machining, preferably milling, in low and medium alloyed steels, stainless steels, with or without raw surface zones. The insert is characterized by a WC—TaC—NbC—Co cemented carbide with a W alloyed Co-binder phase and a coating including an innermost layer of $TiC_xN_yO_z$ with columnar grains and a top layer at least on the rake face of a smooth $\alpha\text{-}Al_2O_3$.

WO 01/16389 discloses a coated milling insert particularly useful for milling in low and medium alloyed steels with or without abrasive surface zones during dry or wet conditions at high cutting speed, and milling of hardened steels at high cutting speed. The insert is characterized by WC—Co cemented carbide with a low content of cubic carbides and a highly W-alloyed binder phase and a coating including an innermost layer of $TiC_xN_yO_z$ with columnar grains and a top layer of TiN and an inner layer of $\kappa\text{-}Al_2O_3$.

EP 1352697 provides coated cemented carbide inserts (cuffing tool), particularly useful for milling at high cutting speed in steels and milling in hardened steels. The inserts are characterized by a WC—Co cemented carbide containing NbC and TaC and a W-alloyed binder phase and a coating including a first, innermost layer of $TiC_xN_yO_z$ with equiaxed grains, a layer of $TiC_xN_yO_z$ with columnar grains and at least one layer of $Al_2O_3$ consisting essentially of the $\kappa$-phase.

What is needed is a coated cutting tool with enhanced performance for milling of steels, hardened steels, and tool steels. The invention is directed to these, as well as other, important needs.

SUMMARY OF THE INVENTION

Accordingly, the invention is directed to a cemented carbide substrate with a relatively low amount of cubic carbides, a binder phase, which is medium- to highly-alloyed with W, and a fine to medium WC grain size. This substrate is provided with a wear resistant coating comprising an equiaxed $TiC_xN_yO_z$ layer, a columnar $TiC_xN_yO_z$ layer, and an $\alpha\text{-}Al_2O_3$ layer.

In one embodiment, the invention is directed to cutting tool inserts, comprising:
a cemented carbide body; and
a coating;
wherein said body has a composition comprising:
about 7.5-8.6 wt % Co;
about 0.5-2.5 wt-% of metals selected from the group consisting of Group IVb metal, Group Vb metal, Group VIb metal, and combinations thereof;
balance WC;
wherein said body has a coercivity of about 12.0-15.5 kA/m and an S-value of about 0.81-0.95; and
wherein said coating comprises:
a first (innermost) layer of $TiC_xN_yO_z$ with about $0.7 \leq x+y+z \leq $ about 1 with equiaxed grains and a total thickness<about 1 μm;
a second layer of $TiC_xN_yO_z$ with about $0.7 \leq x+y+z \leq $ about 1 and a thickness of about 1-5 μm with columnar grains; and
an $\alpha\text{-}Al_2O_3$ layer having a thickness of about 1-5 μm.

In another embodiment, the invention is directed to methods of making a cutting tool insert, comprising the steps of:
preparing by a powder metallurgical technique a cemented carbide body comprising:
about 7.5-8.6 wt % Co;
about 0.5-2.5 wt-% of metals selected from the group consisting of Group IVb metal, Group Vb metal, Group VIb metal, and combinations thereof;
balance WC;
wherein said body has a coercivity of about 12.0-15.5 kA/m and an S-value of about 0.81-0.95; and
coating said cemented carbide body with:
a first (innermost) layer of $TiC_xN_yO_z$ with about $0.7 \leq x+y+z \leq $ about 1 with equiaxed grains and a total thickness<about 1 μm using a chemical vapor deposition (CVD)-technique;
a second layer of $TiC_xN_yO_z$ with about $0.7 \leq x+y+z \leq $ about 1 and a thickness of about 1-5 μm with columnar grains using a medium temperature chemical vapor deposition (MTCVD)-technique with acetonitrile as the carbon and nitrogen source for forming said second layer of $TiC_xN_yO_z$ in the temperature range of about 700-950° C.;
an $\alpha\text{-}Al_2O_3$ layer having a thickness of about 1-5 μm using a chemical vapor deposition (CVD)-technique; and
optionally, depositing a TiN top layer having a thickness less than about 1 μm on said $\alpha\text{-}Al_2O_3$ layer.

In yet other embodiments, the invention is directed to methods for wet or dry milling of steels, comprising the step of:
using a cutting tool insert described herein at cutting speeds of about 100-500 m/min with an average feed per tooth of about 0.08-0.55 mm.

In still other embodiments, the invention is directed to methods for wet or dry milling of hardened steels, comprising the step of:
using a cutting tool insert described herein at cutting speeds of about 50-300 m/min, with an average feed per tooth of about 0.05-0.4 mm.

In still further embodiments, the invention is directed to methods for copy milling with high feed milling cutters, comprising the step of:

using a cutting tool insert described herein at cutting speeds of about 75-500 m/min with an average feed per tooth of 0.3-3.0 mm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1 shows in 20000× a scanning electron microscopy image of a fracture cross section of a cemented carbide insert according to the present invention with:
1. Cemented carbide body
2. Innermost $TiC_xN_yO_z$ layer,
3. $TiC_xN_yO_z$ layer with columnar grains and
4. $\alpha$-$Al_2O_3$ layer.

DETAILED DESCRIPTION OF THE INVENTION

According to the present invention, a coated cutting tool insert is provided with a cemented carbide body having a composition of about 7.5-8.6 wt % Co, preferably about 7.7-8.4 wt % Co, most preferably about 7.8-8.3 wt % Co; about 0.5-2.5 wt-%, preferably about 0.8-2.0 wt-%, most preferably about 1.0-1.6 wt-% total amount of the metals Ti, Nb and Ta and balance WC. Ti, Ta, and/or Nb may also be replaced by other elements from groups IVb, Vb, or VIb of the periodic table. The content of Ti is preferably on a level corresponding to a technical impurity.

In a preferred embodiment, the ratio between the weight concentrations of Ta and Nb is within about 7.0-12.0, preferably about 7.6-11.4, most preferably about 8.2-10.5.

In an alternative preferred embodiment, the ratio between the weight concentrations of Ta and Nb is within about 1.0-5.0, preferably about 1.5-4.5.

The cobalt binder phase is medium to highly alloyed with tungsten. The content of W in the binder phase may be expressed as the S-value=$\sigma$/16.1, where $\sigma$ is the magnetic moment of the binder phase in $\mu Tm^3kg^{-1}$. The S-value depends on the content of tungsten in the binder phase and increases with decreasing tungsten content. Thus, for pure cobalt, or a binder in a cemented carbide saturated with carbon, S=1, and for a binder phase that contains W in an amount that corresponds to the borderline to formation of $\eta$-phase, S=about 0.78.

The cemented carbide body has an S-value of about 0.81-0.95, preferably about 0.82-0.93, most preferably about 0.85-0.90.

The cemented carbide has a coercivity (Hc) of about 12.0-15.5, preferably about 12.5-15.0, most preferably about 12.8-14.8 kA/m.

The coating comprises:
a first (innermost) layer of $TiC_xN_yO_z$ with about $0.7 \leq x+y+z \leq$ about 1, preferably z<0.5, more preferably y>x and z<about 0.2, most preferably y>about 0.7, with equiaxed grains and a total thickness<about 1 μm, preferably>about 0.1 μm;

a layer of $TiC_xN_yO_z$ with about $0.7 \leq x+y+z \leq$ about 1, preferably with z<about 0.2, x>about 0.3 and y>about 0.2, most preferably x>about 0.4, with a thickness of about 1-5 μm, preferably about 1.5-4.5 μm, most preferably about 2-4 μm, with columnar grains; and a layer of $Al_2O_3$ consisting of an $\alpha$-phase.

The $Al_2O_3$ layer has a thickness of about 1-5 μm, preferably about 1.5-4.5 μm, and most preferably about 2-4 μm.

In a preferred embodiment, the $Al_2O_3$ layer is strongly textured in the $(10\bar{1}4)$-direction, with a texture coefficient $TC(10\bar{1}4)$ larger than about 1.2, preferably between about 1.4 and about 4. The texture coefficient (TC) for the alumina layer is determined according to the following formula:

$$TC(hkil) = \frac{I(hkil)}{I_0(hkil)} \left[ \frac{1}{n} \sum_{n=1}^{n} \frac{I(hkil)}{I_0(hkil)} \right]^{-1} \quad (1)$$

where
I(hkil)=measured intensity of the (hkil) reflection
$I_O$(hkil)=standard intensity according to JCPDS card no 46-1212
n=number of reflections used in the calculation
(hkil) reflections used are: $(10\bar{1}2)$, $(10\bar{1}4)$, $(11\bar{2}0)$, $(0006)$, $(11\bar{2}3)$, $(11\bar{2}6)$. Consequently, n=6 and the maximum value of the texture coefficient is about 6.

In an alternative embodiment, the $Al_2O_3$ layer is strongly textured in the (0006)-direction, with a texture coefficient TC(0006) larger than about 1.2, preferably between about 1.4 and about 4.3.

In another alternative embodiment, the $Al_2O_3$ layer is strongly textured in the $(10\bar{1}2)$-direction, with a texture coefficient $TC(10\bar{1}2)$ larger than about 2.5, preferably larger than about 3, most preferably larger than about 3.5.

In a further alternative embodiment, there is a thin, less than about 1 μm thick, TiN top layer on the $\alpha$-$Al_2O_3$ layer.

The present invention also relates to a method of making a cutting insert by powder metallurgical technique, wet milling of powders forming hard constituents and binder phase, compacting the milled mixture to bodies of desired shape and size and sintering, comprising a cemented carbide substrate and a coating. According to the method a substrate is provided with a composition of about 7.5-8.6 wt % Co, preferably about 7.7-8.4 wt % Co, most preferably about 7.8-8.3 wt % Co; about 0.5-2.5 wt-%, preferably about 0.8-2.0 wt-%, most preferably about 1.0-1.6 wt-% total amount of the metals Ti, Nb and Ta and balance WC. Ti, Ta, and/or Nb may also be replaced by other elements from groups IVb, Vb, or VIb of the periodic table. The content of Ti is preferably on a level corresponding to a technical impurity.

In a preferred embodiment, the ratio between the weight concentrations of Ta and Nb is within about 7.0-12.0, preferably about 7.6-11.4, most preferably about 8.2-10.5.

In an alternative preferred embodiment, the ratio between the weight concentrations of Ta and Nb is within about 1.0-5.0, preferably about 1.5-4.5.

The coercivity depends on the grain size of the starting powders and milling and sintering conditions and has to be determined by experiments. The desired S-value depends on the starting powders and sintering conditions and also has to be determined by experiments.

Onto the substrate is deposited
a first (innermost) layer of $TiC_xN_yO_z$ with about $0.7 \leq x+y+z \leq$ about 1, preferably z<0.5, more preferably y>x and z<about 0.2, most preferably y>about 0.7, with equiaxed grains and a total thickness<about 1 μm, preferably>about 0.1 μm, according to known technique;

a layer of $TiC_xN_yO_z$ with about $0.7 \leq x+y+z \leq$ about 1, preferably with z<about 0.2, x>about 0.3 and y>about 0.2, most preferably x>about 0.4, with a thickness of about 1-5 μm, preferably about 1.5-4.5 μm, most preferably about 2-4 μm, with columnar grains with MTCVD-technique onto the cemented carbide using acetonitrile as the carbon and nitrogen source for forming the layer in the temperature range of about 700-950° C.; and a layer of $Al_2O_3$ consisting of the α-phase with a thickness of about 1-5 μm, preferably about 1.5-4.5 μm, and most preferably about 2-4 μm according to known technique.

In an alternative embodiment, a thin, less than about 1 μm, TiN top layer is deposited on the α-$Al_2O_3$ layer using known technique.

In a further preferred embodiment, the cutting tool insert as described above is treated after coating with a wet blasting or brushing operation, such that the surface quality of the coated tool is improved.

The invention also relates to the use of cutting tool inserts according to the above for wet or dry milling of steels at cutting speeds of about 100-500 m/min, preferably about 150-450 m/min with an average feed per tooth of about 0.08-0.55 mm, preferably about 0.1-0.45 mm depending on cutting speed and insert geometry, or hardened steels at cutting speeds of about 50-300 m/min, preferably about 75-250 m/min, with an average feed per tooth of about 0.05-0.4 mm, preferably about 0.8-0.35 mm depending on cutting speed and insert geometry, or copy milling with high feed milling cutters in tool steel at cutting speeds of about 75-500 m/min preferably about 100-400 m/min with an average feed per tooth of about 0.3-3.0 mm depending on cutting speed and insert geometry.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned hereunder are incorporated herein by reference. Unless mentioned otherwise, the techniques employed or contemplated herein are standard methodologies well known to one of ordinary skill in the art. The materials, methods, and examples are illustrative only and not limiting.

The present invention is further defined in the following Examples, in which all parts and percentages are by weight and degrees are Celsius, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

EXAMPLES

Example 1

Grade A: A cemented carbide substrate in accordance with the invention with the composition 8.1 wt % Co, 1.0 wt % Ta, 0.2 wt % Nb, and balance WC, with a binder phase alloyed with W corresponding to an S-value of 0.88 was produced by conventional milling of the powders, pressing of green compacts and subsequent sintering at 1430° C. The Hc value of the cemented carbide was 13.9 kA/m, indicating a mean intercept length of about 0.7 μm. The substrate was coated with a 0.1 μm thick layer of TiN, having equiaxed grains, a 3.1 μm thick layer of columnar $TiC_xN_yO_z$ deposited at 835-850° C. with acetonitrile as carbon and nitrogen source, yielding an approximated carbon to nitrogen ratio x/y=1.5 with z<0.1, and a 3.0 μm thick layer of α-$Al_2O_3$ deposited at about 1000° C. X-ray diffraction showed that the α-$Al_2O_3$ layer had a TC(10 $\overline{1}$ 4) of 2.1. The cutting tool insert was treated after coating with a wet blasting operation. FIG. 1 shows in 20000× a scanning electron microscopy image of a fracture cross section of the coated cemented carbide.

Grade B: A cemented carbide substrate according to Grade A was combined with a 4.1 μm thick layer of columnar $TiC_xN_yO_z$ deposited at 835-850° C. with acetonitrile as carbon and nitrogen source, yielding an approximated carbon to nitrogen ratio x/y=1.5, a 1.6 μm layer of κ-$Al_2O_3$ and a thin TiN layer.

Grades A and B were tested in a face milling operation in a tool steel.

| Operation | Face milling |
|---|---|
| Cutter diameter | 100 mm |
| Work piece | Bar |
| Material | Hardox 500 |
| Insert type | OFEN070405TN-D18 |
| Cutting speed | 100 m/min |
| Feed | 0.33 mm/tooth |
| Depth of cut | 2-6 mm |
| Width of cut | 40-80 mm |
| Coolant | No |

| Results | Tool life (components) |
|---|---|
| Grade A (grade according to invention) | 6 |
| Grade B | 4 |

The test was stopped at the same maximum flank wear for the two grades. The wear resistance was much improved with the grade according to the invention and a smoother wear was observed.

Example 2

Grade C: A grade according to EP 1347076 with a substrate with composition 8.0 wt % Co, 1.0 wt % Ta, 0.1 wt % Nb and balance WC, a binder phase alloyed with W corresponding to an S-value of 0.90, and a Hc value of 15.5 kA/m was combined with a coating consisting of a 3.4 μm thick $Ti_xAl_yN$ layer with x/y=0.55, followed by a 0.2 μm thick TiN layer.

Grades A, B and C were tested in a square shoulder milling operation in steel.

| Operation | Square shoulder milling |
|---|---|
| Cutter diameter | 100 mm |
| Work piece | Bar |
| Material | AISI 4140 |
| Insert type | XOMX180608TR-M14 |
| Cutting speed | 250 m/min |
| Feed | 0.22 mm/tooth |
| Depth of cut | 8 mm |
| Width of cut | 40-80 mm |
| Coolant | No |

| Results | Tool life (components) |
| --- | --- |
| Grade A (grade according to invention) | 50 |
| Grade B | 30 |
| Grade C | 32 |

The test was stopped at the same maximum flank wear for the three grades. Inserts in Grades B and C suffered from lack of wear resistance.

Example 3

Inserts in Grades A, B, and C were tested in a high feed copy milling operation in tool steel.

| Operation | High feed copy milling |
| --- | --- |
| Cutter diameter | 50 mm |
| Work piece | Bar |
| Material | X 155 CrVMo 12 1 |
| Insert type | 218.19-160T04-MD11 |
| Cutting speed | 180 m/min |
| Feed | 1.5 mm/tooth |
| Depth of cut | 1.5 mm |
| Width of cut | 40 mm |
| Coolant | No |

| Results | Tool life (components) |
| --- | --- |
| Grade A (grade according to invention) | 5 |
| Grade B | 3 |
| Grade C | 4 |

The test was stopped at the same maximum flank wear. Grade B and C suffered from lack of wear resistance in combination with edge chipping.

When ranges are used herein for physical properties, such as molecular weight, or chemical properties, such as chemical formulae, all combinations and subcombinations of ranges specific embodiments therein are intended to be included.

The disclosures of each patent, patent application, and publication cited or described in this document are hereby incorporated herein by reference, in their entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

The invention claimed is:

1. A method of making a cutting tool insert, comprising:
preparing by a powder metallurgical technique a cemented carbide body comprising:
about 7.5-8.6 wt % Co; about 0.5-2.5 wt-% of metals selected from the group consisting of Group IVb metal, Group Vb metal, Group VIb metal, and combinations thereof; balance WC; wherein said body has a coercivity of about 12.0-15.5 kA/m and an S-value of about 0.81-0.95; and
coating said cemented carbide body with:
a first (innermost) layer of $TiC_xN_yO_z$ with about $0.7 \leq x+y+z \leq$ about 1 with equiaxed grains and a total thickness<about 1 μm using a chemical vapor deposition (CVD)-technique;
a second layer of $TiC_xN_yO_z$ with 0.7 about$\leq x+y+z \leq$about 1 and a thickness of about 1-5 μm with columnar grains using a medium temperature chemical vapor deposition (MTCVD)-technique with acetonitrile as the carbon and nitrogen source for forming said second layer of $TiC_xN_yO_z$ in a temperature range of about 700-950° C.;
an $\alpha$-$Al_2O_3$ layer having a thickness of about 1-5 μm using a chemical vapor deposition (CVD)-technique; and optionally,
depositing a TiN top layer having a thickness less than about 1 μm on said $\alpha$-$Al_2O_3$ layer.

2. The method according to claim 1, wherein said Group IVb metal is Ti.

3. The method according to claim 1, wherein said Group Vb metal is at least one metal selected from the group consisting of Nb and Ta.

4. The method according to claim 1, wherein said Co is present at a level of about 7.7-8.4 wt %.

5. The method according to claim 1, wherein said metals selected from the group consisting of Group IVb metal, Group Vb metal, Group VIb metal, and combinations thereof are present at a level of about 0.8-2.0 wt-%.

6. A method for wet or dry milling of steels, comprising:
providing a cutting tool insert comprising:
a cemented carbide body; and
a coating;
wherein said body has a composition comprising:
about 7.5-8.6 wt % Co;
about 0.5-2.5 wt-% of metals selected from the group consisting of Group IVb metal, Group Vb metal, Group VIb metal, and combinations thereof;
balance WC;
wherein said body has a coercivity of about 12.0-15.5 kA/m and an S-value of about 0.81-0.95; and
wherein said coating comprises:
a first (innermost) layer of $TiC_xN_yO_z$ with about $0.7 \leq x+y+z \leq$ about 1 with equiaxed grains and a total thickness<about 1 μm;
a second layer of $TiC_xN_yO_z$ with about $0.7 \leq x+y+z \leq$ about 1 and a thickness of about 1-5 μm with columnar grains; and
an $\alpha$-$Al_2O_3$ layer having a thickness of about 1-5 μm; and
cutting at cutting speeds of about 100-500 m/min with an average feed per tooth of about 0.08-0.55 mm.

7. The method according to claim 6, wherein said Group IVb metal is Ti.

8. The method according to claim 6, wherein said Group Vb metal is at least one metal selected from the group consisting of Nb and Ta.

9. The method according to claim 6, wherein said Co is present at a level of about 7.7-8.4 wt %.

10. The method according to claim 6, wherein said metals selected from the group consisting of Group IVb metal, Group Vb metal, Group VIb metal, and combinations thereof are present at a level of about 0.8-2.0 wt-%.

11. A method for wet or dry milling of hardened steels, comprising:
providing a cutting tool insert comprising:
a cemented carbide body; and
a coating;
wherein said body has a composition comprising:
about 7.5-8.6 wt % Co;
about 0.5-2.5 wt-% of metals selected from the group consisting of Group IVb metal, Group Vb metal, Group VIb metal, and combinations thereof;
balance WC;

wherein said body has a coercivity of about 12.0-15.5 kA/m and an S-value of about 0.81-0.95; and wherein said coating comprises:

a first (innermost) layer of $TiC_xN_yO_z$ with about $0.7 \leq x+y+z \leq$ about 1 with equiaxed grains and a total thickness<about 1 μm;

a second layer of $TiC_xN_yO_z$ with about $0.7 \leq x+y+z \leq$ about 1 and a thickness of about 1-5 μm with columnar grains; and an $\alpha\text{-}Al_2O_3$ layer having a thickness of about 1-5 μm; and cutting at cutting speeds of about 50-300 m/min, with an average feed per tooth of about 0.05-0.4 mm.

12. The method according to claim 11, wherein said Group IVb metal is Ti.

13. The method according to claim 11, wherein said Group Vb metal is at least one metal selected from the group consisting of Nb and Ta.

14. The method according to claim 11, wherein said Co is present at a level of about 7.7-8.4 wt %.

15. The method according to claim 11, wherein said metals selected from the group consisting of Group IVb metal, Group Vb metal, Group VIb metal, and combinations thereof are present at a level of about 0.8-2.0 wt-%.

16. A method for copy milling with high feed milling cutters, comprising:

providing a cutting tool insert comprising:

a cemented carbide body; and a coating;

wherein said body has a composition comprising:

about 7.5-8.6 wt % Co;

about 0.5-2.5 wt-% of metals selected from the group consisting of Group IVb metal, Group Vb metal, Group VIb metal, and combinations thereof;

balance WC;

wherein said body has a coercivity of about 12.0-15.5 kA/m and an S-value of about 0.81-0.95; and wherein said coating comprises:

a first (innermost) layer of $TiC_xN_yO_z$ with about $0.7 \leq x+y+z \leq$ about 1 with equiaxed grains and a total thickness<about 1 μm;

a second layer of $TiC_xN_yO_z$ with about $0.7 \leq x+y+z \leq$ about 1 and a thickness of about 1-5 μm with columnar grains; and an $\alpha\text{-}Al_2O_3$ layer having a thickness of about 1-5 μm; and cutting at cutting speeds of about 75-500 m/min with an average feed per tooth of 0.3-3.0 mm.

17. The method according to claim 16, wherein said Group IVb metal is Ti.

18. The method according to claim 16, wherein said Group Vb metal is at least one metal selected from the group consisting of Nb and Ta.

19. The method according to claim 16, wherein said Co is present at a level of about 7.7-8.4 wt %.

20. The method according to claim 16, wherein said metals selected from the group consisting of Group IVb metal, Group Vb metal, Group VIb metal, and combinations thereof are present at a level of about 0.8-2.0 wt-%.

* * * * *